United States Patent [19]

Adachi et al.

[11] Patent Number: 5,180,691

[45] Date of Patent: Jan. 19, 1993

[54] METHOD OF MANUFACTURING A SEMICONDUCTOR DEVICE SEALED WITH MOLDING RESIN EMPLOYING A STRESS BUFFERING FILM OF SILICONE

[75] Inventors: Etsushi Adachi; Hiroshi Adachi; Hiroshi Mochizuki; Hirozoh Kanegae, all of Hyogo, Japan

[73] Assignee: Mitsubishi Denki Kabushiki Kaisha, Tokyo, Japan

[21] Appl. No.: 827,220

[22] Filed: Jan. 30, 1992

[30] Foreign Application Priority Data

Jan. 31, 1991 [JP] Japan .................................. 3-10908

[51] Int. Cl.⁵ .......................................... H01L 21/02
[52] U.S. Cl. .................... 437/235; 437/228; 437/248; 437/219
[58] Field of Search ............... 437/225, 235, 228, 248, 437/209, 211, 214, 219

[56] References Cited

U.S. PATENT DOCUMENTS

| | | | |
|---|---|---|---|
| 4,827,326 | 5/1989 | Altman et al. | 437/235 |
| 4,988,403 | 1/1991 | Matuo | 437/228 |
| 5,023,204 | 6/1991 | Adachi et al. | 437/228 |
| 5,081,202 | 1/1992 | Adachi et al. | 528/43 |

FOREIGN PATENT DOCUMENTS

| | | |
|---|---|---|
| 63-104450 | 9/1981 | Japan . |
| 56-118334 | 5/1988 | Japan . |
| 0269554 | 11/1988 | Japan . |
| 1-92224 | 4/1989 | Japan . |

*Primary Examiner*—Brian E. Hearn
*Assistant Examiner*—Trung Dang
*Attorney, Agent, or Firm*—Lowe, Price, LeBlanc & Becker

[57] ABSTRACT

The disclosed is a method of manufacturing a semiconductor device sealed with molding resin. An aluminum interconnection including an aluminum electrode pad is formed on a semiconductor substrate having an element. A silicone ladder polymer expressed by the following general formula is formed on the semiconductor substrate to cover the element. The silicone ladder polymer film is selectively etched by an aromatic organic solvent to expose the surface of the aluminum electrode pad. The temperature of the silicone ladder polymer film is elevated at a temperature elevating rate of 20° C./min or more, and then, the silicone ladder polymer film is cooled at a cooling rate of 20° C./min or more to form a cured stress buffering protective film for buffering a stress applied to the element.

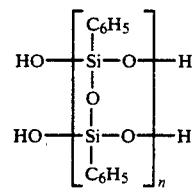

(in the formula, n is an integer which makes the weight-average molecular weight be in the range of 100,000 to 200,000.)

5 Claims, 5 Drawing Sheets

METHOD OF MANUFACTURING A SEMICONDUCTOR DEVICE SEALED WITH MOLDING RESIN EMPLOYING A STRESS BUFFERING FILM OF SILICONE

BACKGROUND OF THE INVENTION

1. Field of the Invention

The present invention relates generally to semiconductor devices sealed with molding resin, and, more particularly, to a semiconductor device sealed with molding resin which is improved to have enhanced reliability. The present invention further relates to a method of manufacturing such a semiconductor device sealed with molding resin.

2. Description of the Background Art

As miniaturization of semiconductor elements progresses, volatilization failure or malfunctions of elements caused by the stress of sealing resin becomes a problem in conventional semiconductor devices sealed with resin. In order to solve this problem, a method in which a stress buffering film of a resin layer is formed on an element is proposed.

Conventionally, polyimide is often used for the resin layer. A conventional example using polyimide as a stress buffering film will be described.

FIG. 1 is a cross sectional view of a semiconductor device disclosed in Japanese Patent Laying-Open No. 56-118334 (1981). Referring to FIG. 1, an aluminum interconnection pattern 3 is formed on a semiconductor chip 1. Aluminum interconnection pattern 3 includes an aluminum electrode pad 3a. A phospho-silicate glass (PSG) film 8 is formed on semiconductor chip 1 to cover aluminum interconnection pattern 3. An opening is provided in PSG film 8 for exposing the surface of aluminum electrode pad 3a. A polyimide film 9, which is to serve as a stress buffering protective film for buffering a stress applied to an element, is provided on semiconductor chip 1. Although not shown in the drawing, a gold wire is bonded to aluminum electrode pad 3a, and the whole of the semiconductor device is sealed within, for example, an insulating housing.

FIGS. 2A-2D are cross sectional views of a semiconductor device including a polyimide stress buffering film disclosed in Japanese Patent Laying-Open No. 63-104450 (1988) in respective steps of a manufacturing process.

Referring to FIG. 2A, a SiO₂ film 12 is formed on a silicon substrate 11. Although not shown, an element is provided in silicon substrate 11. An aluminum interconnection pattern 3 is formed on SiO₂ film 12. Aluminum interconnection pattern 3 includes an aluminum electrode pad 3a. A SiN film 4 is formed to cover aluminum interconnection pattern 3. An opening 4a is provided in SiN film 4 for exposing aluminum electrode pad 3a in aluminum interconnection pattern 3.

Referring to FIG. 2B, a PSG film 8 is formed over semiconductor substrate 11 by a CVD process to fill opening 4a in SiN film 4.

Referring to FIG. 2C, a polyimide stress buffering protective film 9 is formed on PSG film 8. Polyimide film 9 is selectively etched to form an opening 9a in a part positioned on aluminum electrode pad 3a.

Referring to FIG. 2D, after etching of polyimide film 9, PSG film 8 is etched using a mixed liquid of HF and NH₄F to expose aluminum electrode pad 3a. Then, although not shown, an Au wire is connected to aluminum electrode pad 3a, and the whole device is sealed with molding resin.

Next, the reason for forming PSG film 8 will be described. If there is no PSG film 8 for covering aluminum electrode pad 3a, an alkaline solution used as an etchant corrodes the surface of aluminum interconnection film 3 during etching of polyimide film 9, and therefore, aluminum electrode pad 3a is made rough. The roughness of aluminum electrode pad 3a causes failure in the connection of aluminum electrode pad 3a to the Au wire when the Au wire is bonded, and therefore, it causes reliability of the semiconductor device to be lowered. PSG film 8 serves for preventing the roughness of the aluminum electrode pad.

As described above, a polyimide film is used as a stress buffering protective film in the prior art.

However, in the case of the prior art illustrated in FIG. 1, a tensile stress is generated in polyimide film 9 during formation of polyimide film 9 (by a curing reaction). After formation of the film, polyimide film 9 has a residual stress of about $5 \times 10^8$ dyn/cm². Referring to FIG. 1, this tensile stress causes stress migration of aluminum in underlying aluminum interconnection pattern 3. Therefore, defects in the shape of a wedge are generated in aluminum interconnection 3 during formation of polyimide film 9, and there is a problem of decline in reliability of the semiconductor device.

In addition, according to the conventional example illustrated in FIGS. 2A-2D, it is necessary to form PSG film 8 covering aluminum electrode pad 3a for preventing aluminum electrode pad 3a from being rough during etching of polyimide film 9, and it is also necessary to provide the opening in PSG film 8 for exposing aluminum electrode pad 3a, so that there is a problem of complexity of the process as a whole.

SUMMARY OF THE INVENTION

Accordingly, an object of the present invention is to provide a semiconductor device sealed with molding resin provided with a stress buffering protective film having an excellent buffering effect on a stress received from the molding resin.

Another object of the present invention is to provide a semiconductor device sealed with molding resin in which there is no defects in an aluminum interconnection film.

Still another object of the present invention is to provide a semiconductor device sealed with molding resin in which the surface of an aluminum electrode pad in an aluminum interconnection film is not rough.

A further object of the present invention is to provide a method of manufacturing a semiconductor device sealed with molding resin as described above.

A still further object of the present invention is to provide a method of manufacturing a semiconductor device sealed with molding resin which is improved for simplifying the process.

A semiconductor device sealed with molding resin in accordance with the present invention for achieving the above objects includes a semiconductor substrate having an element. An aluminum interconnection pattern is provided on the semiconductor substrate to be electrically connected to the element. A stress buffering protective film is provided on the semiconductor substrate to cover the element for buffering a stress applied to the element. The stress buffering protective film is formed of a cured film of a silicone ladder polymer expressed by the following general formula.

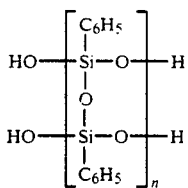

(in the formula, n is an integer.)

According to a preferred embodiment of the present invention, the above integer n is an integer which makes the weight-average molecular weight of the above silicone ladder polymer be in the range of 100,000 to 200,000.

If the weight-average molecular weight is less than 100,000, resistance to cracks is lowered, and if it exceeds 200,000, etching becomes difficult.

In addition, it is preferable that the above silicone ladder polymer is of high purity in which the content of each of alkaline metal, iron, lead, copper, and hydrogen halide is 0.1 ppm or less, and the content of each of uranium and thorium is 0.1 ppb or less.

It is preferable that the internal stress of the silicone ladder polymer film is made to be $3 \times 10^8$ $dyn/cm^2$ or less. According to the present invention, the stress buffering protective film is formed of the cured film of the silicone ladder polymer expressed by the above formula. Curing of the silicone ladder polymer is promoted by dehydration and condensation reaction of end hydroxyl groups, so that almost no volumetric shrinkage is recognized. Therefore, the residual stress in the stress buffering protective film after cooling is small. Accordingly, a highly reliable semiconductor device in which no defects in the shape of a wedge are generated in an aluminum interconnection film is provided.

In a method of manufacturing a semiconductor device sealed with molding resin according to another aspect of the present invention, first, a semiconductor substrate having an element is provided. An aluminum interconnection pattern including an aluminum electrode pad is formed on the semiconductor substrate to be electrically connected to the element. A silicone ladder polymer expressed by the following general formula is formed on the semiconductor substrate to cover the element.

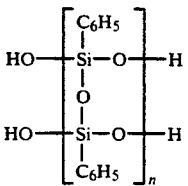

(in the formula, n is an integer.)

The silicone ladder polymer is selectively etched by an aromatic organic solvent to expose the surface of the aluminum electrode pad.

The temperature of the silicone ladder polymer film is elevated at a temperature elevating rate of 20° C./min or more, and then, the silicone ladder polymer film is cooled at a cooling rate of 20° C./min or more, so that a cured stress buffering protective film for buffering a stress applied to the element is formed.

According to a method of manufacturing a semiconductor device sealed with molding resin in accordance with still another aspect of the present invention, the silicone ladder polymer can be etched using an aromatic organic solvent. An aromatic organic solvent does not corrode the aluminum interconnection film. As a result, the surface of the aluminum electrode pad is not made rough.

In addition, the temperature of the silicone ladder polymer film is elevated at a temperature elevating rate of 20° C./min or more, and then, the silicone ladder polymer film is cooled at a cooling rate of 20° C./min or more. This condition is selected to make it possible to inhibit generation of defects in the underlying aluminum interconnection pattern. Therefore, no defects are generated in the aluminum interconnection pattern. Therefore, it is possible to obtain a highly reliable semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described in the following with reference to the drawings.

Figure 1:
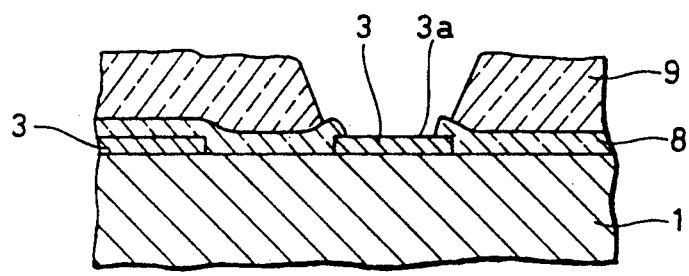
FIG. 1 is a cross sectional view of a semiconductor device according to a first conventional example.
Figure 2A:
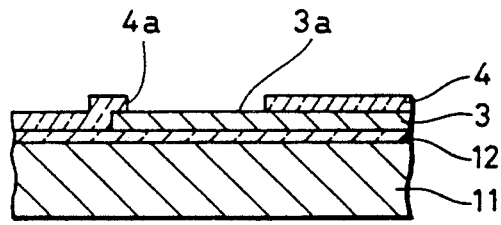
FIGS. 2A to 2D are cross sectional views of a semiconductor device disclosed in a second conventional example in respective steps of a manufacturing process.
Figure 2B:
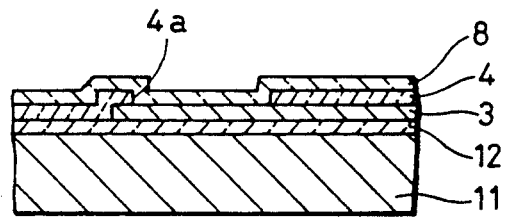
Figure 2C:
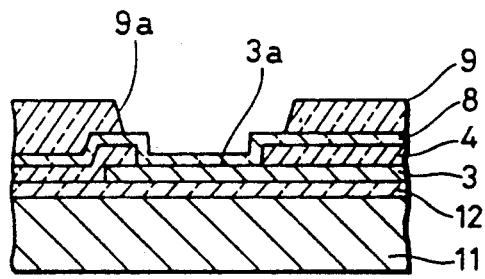
Figure 2D:
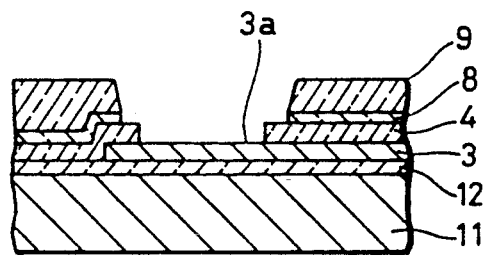
Figure 3:
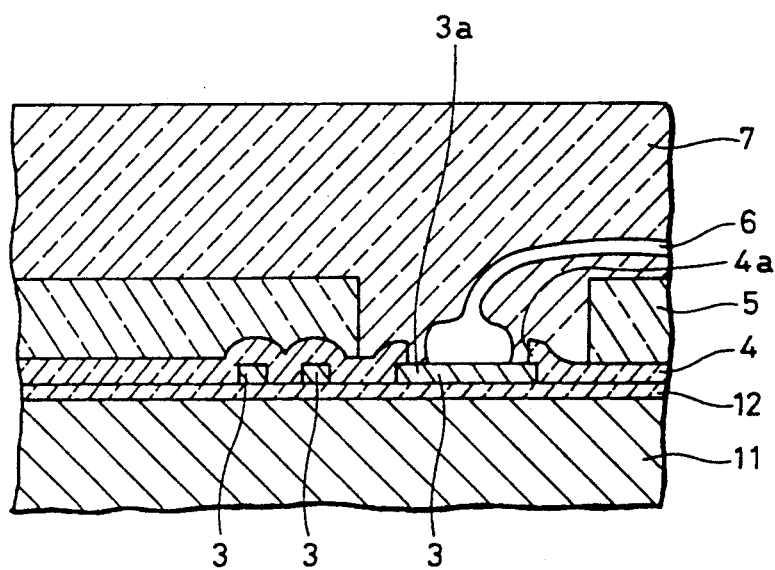
FIG. 3 is a cross sectional view of a semiconductor device according to an embodiment of the present invention.

FIG. 3 is a cross sectional view of a semiconductor device according to an embodiment of the present invention. Referring to FIG. 3, a $SiO_2$ film 12, which is an underlying oxide film, is formed on a semiconductor substrate 11. Although not shown, an element is formed in semiconductor substrate 11. An aluminum interconnection pattern 3 is provided on $SiO_2$ film 12 to be electrically connected to the element. Aluminum interconnection pattern 3 includes an aluminum electrode pad 3a.

A silicon nitride film (SiN film) 4 is provided over semiconductor substrate 11 to cover aluminum interconnection pattern 3. An opening 4a is provided in SiN film 4 for exposing the surface of aluminum electrode pad 3a. A stress buffering protective film 5 is provided on SiN film 4 to cover the element for buffering a stress applied to the element.

The stress buffering protective film is formed of a cured film of a silicone ladder polymer expressed by the following general formula (1).

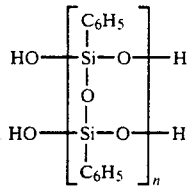

(in the formula, n is an integer which makes the weight-average molecular weight of the silicone ladder polymer be in the range of 100,000 to 200,000.)

The thickness of stress buffering protective film 5 is in the range of 4 μm to 10 μm.

A gold wire 6 is bonded to aluminum electrode pad 3a. The whole of the semiconductor device is sealed with molding resin 7. Curing of the silicone ladder polymer is promoted by dehydration and condensation reaction of end hydroxyl groups, so that almost no volumetric shrinkage is recognized. Accordingly, after cooling, the residual stress in stress buffering protective film 5 is small. Accordingly, no defects in the shape of a wedge are generated in aluminum interconnection pattern 3. Therefore, a highly reliable semiconductor device is provided.

Embodiment 1

Now, a method of manufacturing the semiconductor device illustrated in FIG. 3 will be described with reference to FIGS. 4A–4G.

Figure 4A:
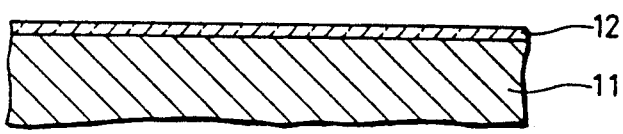
FIGS. 4A to 4G are partial cross sectional views of the semiconductor device according to the embodiment of the present invention in respective steps in sequence of a manufacturing process.

Referring to FIG. 4A, a semiconductor substrate 11 having an element (not shown) is provided. A $SiO_2$ film 12, which is an underlying oxide film, is formed on semiconductor substrate 11.

Figure 4B:
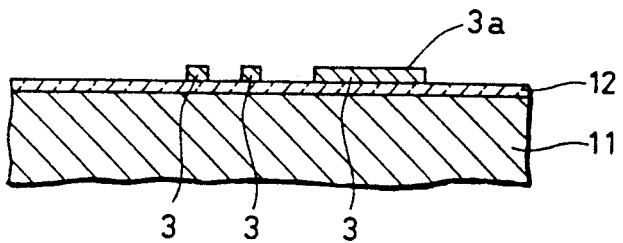
Figure 4C:
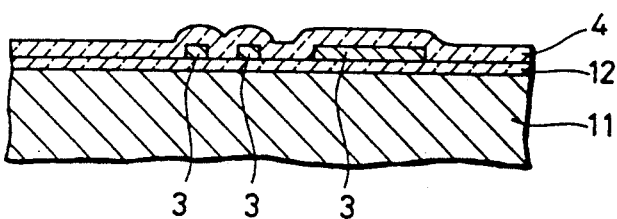

Referring to FIG. 4B, an aluminum interconnection pattern 3 is formed on $SiO_2$ film 12 to be electrically connected to the element (not shown). Aluminum interconnection pattern 3 includes an aluminum electrode pad 3a.

A SiN film 4 is formed over semiconductor substrate 11 to cover aluminum interconnection pattern 3.

Figure 4D:
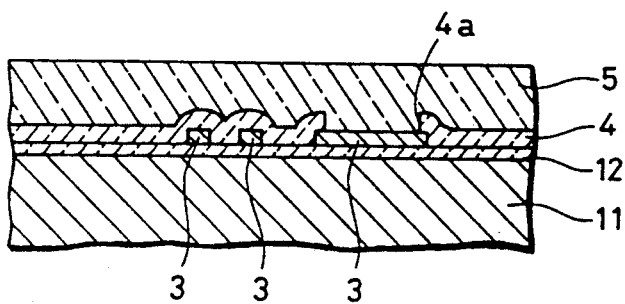

Referring to FIG. 4D, an opening 4a is provided in SiN film 4 for exposing the surface of aluminum electrode pad 3a. SiN film 4 is an inorganic film and has a number of hydroxyl groups on the surface. A solution of a silicone ladder polymer as expressed by the above formula (1) having the weight-average molecular weight of 150,000, in anisole (the concentration is controlled to be 25 wt %) is applied on semiconductor substrate 11 in a rotational manner to cover SiN film 4, so that a silicone ladder polymer film 5 of 4 μm is formed. Then, heat treatment is carried out at 150° C. for 30 minutes.

A method of producing the silicone ladder polymer expressed by formula (1) will be described later as Example for Reference 1. The used silicone ladder polymer is of high purity in which the content of each of alkaline metal, iron, lead, copper, and hydrogen halide is 0.1 ppm or less, and the content of each of uranium and thorium is 0.1 ppb or less.

Figure 4E:
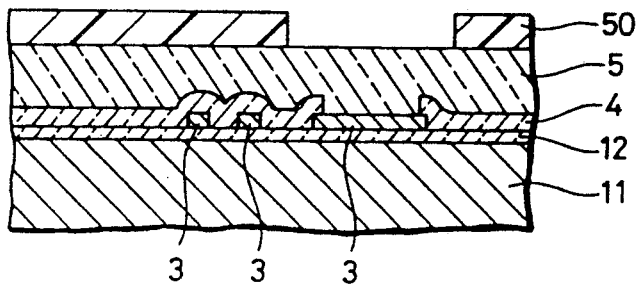

Next, referring to FIG. 4E, after returning the temperature of semiconductor substrate 11 to the room temperature, a positive photoresist OFPR 800 (produced by Tokyo Ohka Kogyo Co. Ltd.) 50 is applied on silicone ladder polymer film 5 (the thickness is 4 μm). A part of photoresist 50 positioned on aluminum electrode pad 3a is selectively removed by exposure using a mask and alkaline development. Then, ultraviolet rays are irradiated to the whole surface of semiconductor substrate 11 including resist 50.

Figure 4F:
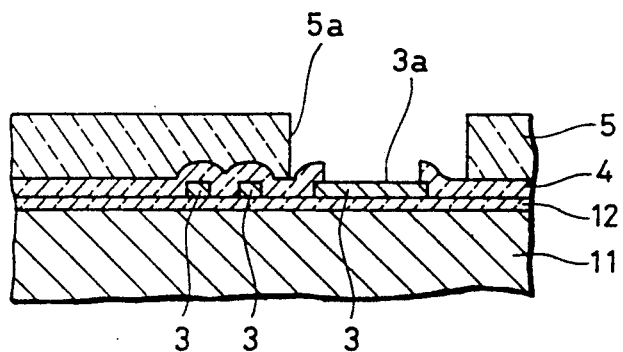
Figure 4G:
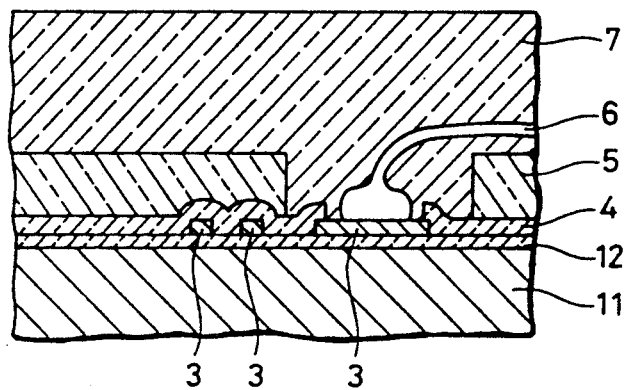

Referring to FIGS. 4E and 4F, spin development is carried out for one minute using a mixed solvent of anisole/xylene in which the anisole concentration is 30 vol % to form an opening 5a in silicone ladder polymer film 5 for exposing the surface of aluminum electrode pad 3a. Then, photoresist 50 is removed by n-butyl acetate.

Referring to FIG. 4F, the temperature of the whole semiconductor substrate 11 is elevated from the room temperature to 350° C. at a temperature elevating rate of 35° C./min and that temperature is maintained for an hour. Then, it is cooled at a cooling rate of 35° C./min to return the temperature to the room temperature. By doing this, a cured silicone ladder polymer film 5, which is to serve as a stress buffering protective film covering a part other than aluminum electrode pad 3a, is formed as illustrated in FIG. 4F. A number of hydroxyl groups are bonded on the surface of SiN film 4, and end hydroxyl groups of the silicone ladder polymer also react with the hydroxyl groups of SiN film 4, and therefore, the adhesion between SiN film 4 and silicone ladder polymer film 5 is enhanced. Then, aluminum electrode pad 3a and a lead frame (not shown) are bonded with a gold wire 6. Then, the whole semiconductor device is sealed with molding resin 7.

In order to examine whether defects are generated in aluminum interconnection pattern 3 or not, the same part of aluminum interconnection pattern 3 was observed at the same magnification with a microscope before and after formation of silicone ladder polymer film 5. A total of three part, the central part and both ends, on the semiconductor element were examined, and generation of defects was not recognized in aluminum interconnection pattern 3.

The reason why defects are not generated in the aluminum interconnection pattern in this embodiment will be described next.

It is generally known that defects caused by stress migration of an aluminum film are generated by a stress of a passivation film (for example, SiN film 4 in FIG. 3) which directly interacts with the aluminum film. Further, it has been recently found out that defects are also generated in the formation process of stress buffering protective film 5.

As a result of repeated studies, we found out that it is possible to inhibit generation of defects in aluminum by using a stress buffering protective film which makes the stress generated during formation of the film be $3 \times 10^8$ din/$cm^2$ or less and by selecting the above-described condition as a condition of the heat treatment for curing the film, i.e. by setting the temperature elevating rate to 20° C./min or more and setting the cooling rate is made to 20° C./min or more.

A polyimide film which has been conventionally used as a stress buffering protective film is formed by applying a solution of a precursor on a substrate and carrying out heat treatment on it. At this time, a ring-closing reaction is passed through, so that volumetric shrinkage is caused, and further, after cooling, the polyimide film has relatively large tensile stress. By contrast, a silicone ladder polymer film as expressed by expression (1) has large molecular weight even in the state of a solution. Therefore, even in a case where heat treatment is carried out after application to the substrate, the curing reaction is promoted by the dehydration and condensation reaction of end hydroxyl groups, so that there is almost no volumetric shrinkage. As a result, the residual stress in the film after cooling is small. The mechanism of generation of stress migration can be explained by a creeping phenomenon, and it is considered that vacancies in the aluminum film are accumulated in a grain boundary to form a void. Accordingly, it is possible to inhibit defects by using a film having a small residual stress and shortening the creeping time. Specifically, the temperature elevating rate and the cooling rate during curing of the film may be made higher. If a silicone ladder polymer film of high purity as expressed by expression (1) is used as the stress buffering protective film, it is possible to prevent the aluminum film from becoming rough even without a PSG film and other protective films.

While a silicone ladder polymer of high purity having weight-average molecular weight of 150,000 is used in the above embodiment, it is possible to use any silicone ladder polymer which has weight-average molecular weight in the range of 120,000 to 20,000.

EXAMPLE FOR COMPARISON 1

The thermally curing processing of the silicone ladder polymer film in Embodiment 1 was carried out under different condition. The thermally curing processing was carried out under the same condition as in the case of Embodiment 1 except that the temperature was elevated from the room temperature to 350° C. at a rate of 4° C./min to obtain a semiconductor device. As in the case of Embodiment 1, defects in aluminum were examined. As a result, among three parts observed, the average number of defects was two.

EXAMPLE FOR COMPARISON 2

The thermally curing processing of the silicone ladder polymer film in Embodiment 1 was carried out under another different condition. The thermally curing processing was carried out as in the case of Embodiment 1 except that the silicone ladder polymer film was cooled to the room temperature at a rate of 2° C./min. Defects in aluminum were examined as in the case of Example 1. As a result, among three parts observed, the average number of defects was two.

EXAMPLE FOR COMPARISON 3

A semiconductor device was manufactured as in the case of Embodiment 1 except that polyimide is substituted for the silicone ladder polymer, and that an alkaline solution was used in etching for exposing the surface of the aluminum electrode pad in the polyimide film. In this case, the surface of the aluminum electrode pad was made rough. Three parts other than the aluminum electrode pad were observed, and the average number of defects was found out. As a result, the number of defects was seven.

EXAMPLE FOR COMPARISON 4

A semiconductor device was manufactured as in the case of Embodiment 1 except that polyimide was substituted for the silicone ladder polymer, and that, after carrying out thermally curing processing as in the case of Embodiment 1, the polyimide was cooled slowly, at a rate of 2° C./hr, to the room temperature. As in the case of Example for Comparison 3, the surface of the aluminum electrode pad was made rough. Defects were examined as in the case of Example for Comparison 3, and the number of defects was eleven.

EXAMPLE FOR REFERENCE 1

The silicone ladder polymer having hydroxyl groups at the end as expressed by formula (1) was produced by a method disclosed in Japanese Patent Laying-Open No. 1-92224 (1989) disclosed by the inventors of the present invention or the like. A summary of that method will be described in the following. A material, phenyltrichlorosilane, was distilled under a reduced pressure of 15 mmHg (under a stream of nitrogen) at a temperature in the range of 81° C. to 82° C. The distilled phenyltrichlorosilane (317.4 g) was mixed with 960 ml of methylisobutylketone of ELSS grade. The mixed solution was moved into a four-mouthed flask having a capacity of 2 l to which a dropping funnel, a thermometer, and a stirrer are mounted and was cooled to 20° C. Then, while cooling to maintain that temperature, 200 ml of high purity water was dropped slowly under stirring, spending time in the range of an hour to three hours. At that time, hydrogen chloride was violently generated. After completion of the dropping, stirring was further continued for two hours to complete the hydrolysis reaction. This prepolymer solution was moved into a separating funnel and placed still, so that the prepolymer solution was separated into two layers. Then, a water layer of the lower layer which includes a large amount of hydrogen chloride was removed, an organic layer including the prepolymer was withdrawn, high purity water of the same volume as that of the organic layer was added to the organic layer, and it was shaken and cleaned. After repeating this cleaning operation five times, the amount of impurities contained in the prepolymer after cleaning was analyzed by an ion chromatography analyzing apparatus (produced by Yokogawa Electric Corp. item No. IC-500). As a result, the content of chlorine ions in the prepolymer was about 1000 ppm after the first cleaning and 1 ppm or less after the third cleaning. The concentration of potassium ions was also lowered as cleaning was repeated, and it was 1 ppm or less after the third cleaning. It can be made 0.1 ppm or less by further repeating cleaning.

Then, the weight-average molecular weight of the prepolymer was measured with a gel permeation chromatography (produced by Nihon Bunko Co. Ltd. item No. TRI-ROTARVI). The content of impurities in the prepolymer after three times of cleaning was as described in the following. Specifically, the content of each of sodium, potassium, iron, copper, lead, and chlorine was 1 ppm or less, and the content of each of uranium and thorium, which are radio active elements, was 1 ppb or less. By further repeating cleaning, they became 0.1 ppm or less and 0.1 ppb or less, respectively.

Then, the structure of the prepolymer was examined with an infrared spectroscopy method (produced by Nihon Bunko Co. Ltd. item No. FT-IR-111 type). A double peak which attributes to a siloxane bond was seen in the vicinity of 1100 cm$^{-1}$, so that it was confirmed that the prepolymer had the structure expressed by formula (1).

As described above, according to a semiconductor device of the present invention, a stress buffering protective film is formed of a cured film of a silicone ladder polymer as expressed by formula (1). Curing of the silicone ladder polymer is promoted by a dehydration and condensation reaction of end hydroxyl groups, so that almost no volumetric shrinkage is seen. Therefore, the residual stress in the stress buffering protective film after cooling is small. Accordingly, a highly reliable semiconductor device in which no defects in the shape of a wedge are generated in the aluminum interconnection film is provided.

According to a method of manufacturing a semiconductor device in accordance with another aspect of the present invention, the silicone ladder polymer can be etched using an aromatic organic solvent. An aromatic organic solvent does not corrode an aluminum interconnection film. As a result, the surface of an aluminum electrode pad is not made rough. Therefore, when an Au wire is bonded, the connection of the Au wire to the aluminum electrode pad becomes satisfactory. Accordingly, the reliability of the semiconductor device becomes high.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device sealed with molding resin, comprising the steps of:
   providing a semiconductor substrate having an element;
   forming an aluminum interconnection pattern including an aluminum electrode pad on said semiconductor substrate to be electrically connected to said element;
   forming a silicone ladder polymer film expressed by the following general formula on said semiconductor substrate to cover said element;

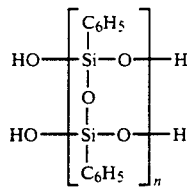

(in the formula, n is an integer.)
   selectively etching said silicone ladder polymer film by an aromatic organic solvent to expose the surface of said aluminum electrode pad; and
   elevating the temperature of said silicone ladder polymer film at a temperature elevating rate of 20° C./min or more, and then, cooling said silicone ladder polymer film at a cooling rate of 20° C./min or more to form a cured stress buffering protective film for buffering a stress applied to said element.

2. The method according to claim 1, wherein said integer n is an integer which makes the weight-average molecular weight of said silicone ladder polymer be in the range of 100,000 to 200,000.

3. The method according to claim 1, wherein said silicone ladder polymer film is formed to make the thickness of said stress buffering protective film be in the range of 4 μm to 10 μm.

4. The method according to claim 1, wherein said silicone ladder polymer film is formed by a method in which application is carried out in a rotational manner.

5. The method according to claim 1, wherein said silicone ladder polymer is a polymer in which the content of each of alkaline metal, iron, lead, copper, and hydrogen halide is 0.1 ppm or less, and the content of each of uranium and thorium is 0.1 ppb or less.

* * * * *